(12) United States Patent
Jang et al.

(10) Patent No.: US 7,518,696 B2
(45) Date of Patent: Apr. 14, 2009

(54) LIQUID CRYSTAL DISPLAY PANEL AND METHOD OF FABRICATING THE SAME HAVING PARTICULAR SPACERS

(75) Inventors: Min-sok Jang, Suwon-si (KR); Jeong-uk Heo, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 11/505,691

(22) Filed: Aug. 17, 2006

(65) Prior Publication Data
US 2007/0069204 A1 Mar. 29, 2007

(30) Foreign Application Priority Data
Sep. 13, 2005 (KR) ............... 10-2005-0084975

(51) Int. Cl.
*G02F 1/1339* (2006.01)
*G02F 1/1335* (2006.01)
*G02F 1/1333* (2006.01)

(52) U.S. Cl. ............... 349/155; 349/106; 349/110
(58) Field of Classification Search ............ 349/155, 349/106, 158, 110
See application file for complete search history.

(56) References Cited

U.S. PATENT DOCUMENTS

| | | | |
|---|---|---|---|
| 6,281,955 B1 * | 8/2001 | Midorikawa et al. | 349/106 |
| 6,982,769 B2 * | 1/2006 | Ishino | 349/43 |
| 7,133,108 B2 * | 11/2006 | Shimizu et al. | 349/155 |
| 7,142,277 B2 * | 11/2006 | Choi et al. | 349/155 |
| 2005/0275787 A1 * | 12/2005 | Inoue et al. | 349/155 |
| 2007/0002263 A1 * | 1/2007 | Kim et al. | 349/156 |

FOREIGN PATENT DOCUMENTS

| | | |
|---|---|---|
| JP | 2002-341354 | 11/2002 |
| KR | 1020040099748 | 12/2004 |
| KR | 1020050045124 | 5/2005 |

* cited by examiner

*Primary Examiner*—Mike Qi
(74) *Attorney, Agent, or Firm*—Cantor Colburn LLP

(57) ABSTRACT

An LCD panel includes a first substrate including a first substrate material, a plurality of thin film transistors ("TFTs") formed on the first substrate material each having a drain electrode, and an organic layer formed on the plurality of TFTs which further includes a color filter layer, a second substrate disposed opposite to the first substrate and including a second substrate material, a main column spacer having a first end connected to the first substrate, and a second end connected to the second substrate, a sub column spacer having a first end connected to one of the first and second substrates, and a second end being spaced apart from the other one of the first and second substrates, and a recessed portion formed in at least one of the first and second substrates corresponding to the sub column spacer.

16 Claims, 10 Drawing Sheets

LIQUID CRYSTAL DISPLAY PANEL AND METHOD OF FABRICATING THE SAME HAVING PARTICULAR SPACERS

This application claims priority to Korean Patent Application No. 2005-0084975, filed on Sep. 13, 2005, and all the benefits accruing therefrom under 35 U.S.C. § 119, and the contents of which in its entirety are herein incorporated by reference.

BACKGROUND OF THE INVENTION

1. Field of the Invention

The present invention relates to a liquid crystal display ("LCD") panel and a method of fabricating the same, and more particularly, to an LCD panel in which a column spacer is applied to a color filter on array ("COA") structure and a method of fabricating the same.

2. Description of the Related Art

In a general liquid crystal display ("LCD"), an LCD panel comprises a thin film transistor ("TFT") substrate, a color filter substrate, and a liquid crystal layer sandwiched between the TFT substrate and the color filter substrate. Because the TFT LCD does not emit light on its own, a backlight unit is additionally provided behind the TFT substrate for that purpose. Further, the amount of light transmitted from the backlight unit through the TFT LCD is adjusted depending on the molecular arrangement of the liquid crystal layer.

In fabricating the LCD panel, it is important to precisely align the TFT substrate and the color filter substrate when they are combined to each other. To reduce production costs and to increase the sizes of LCD panels, the sizes of the TFT substrate and the color filter substrate are correspondingly increasing. However, as the sizes of the TFT substrate and the color filter substrate increase, errors in the alignment between the two substrates during their combination are also likely to increase. Thus, problems arise in that defects of the combination increase and the misalignment of the two substrates causes the aperture ratio to decrease.

To solve these problems, a color filter on array ("COA") structure has been proposed. The proposed COA is composed of a first substrate made by forming a TFT on a TFT substrate material and then forming a color filter layer thereon, and a second substrate facing the first substrate is made by forming a common electrode and a black matrix on a second substrate material or alternatively forming only the common electrode on the second substrate material. The COA structure does not require an additional area for combining the two substrates to each other, thereby decreasing the chances misalignment when both substrates are combined.

In an LCD panel having the COA structure, a spacer is used to maintain a constant cell gap between the first substrate formed with the color filter layer and the second substrate disposed in parallel with the first substrate. Conventionally, a bead spacer has been used as the spacer, but the beads are not irregularly arranged, and as a consequence, a blemish or light leakage arises. To overcome these shortcomings, a column spacer is widely used for maintaining a constant cell gap. The column spacer is regularly arranged on either of the first or second substrates.

When the number of column spacers used is relatively small they may be deformed by pressure, so that the amount of liquid crystal filled between the two substrates is easily controlled. When the amount of liquid crystal is easily controlled, the liquid crystal injection margin of the corresponding display is advantageously increased. However, when only a few column spacers are utilized, stress applied to each individual column spacer are more intense, so that the column spacer may be severely deformed or the column spacer or a film under the column spacer may break.

However, when the number of column spacers used is relatively large, the stress applied to each individual column spacer decreases, but the pressure deformation also decreases, thereby decreasing the liquid crystal injection margin. Thus, there is a trade-off relationship between the former and the latter.

BRIEF SUMMARY OF THE INVENTION

Accordingly, it is an aspect of the present invention to provide an LCD panel and a method of fabricating the same, in which a large liquid crystal injection margin may be secured, and stress due to pressure applied to the LCD panel may be efficiently dispersed.

The foregoing and/or other aspects of the present invention can achieved by providing an exemplary embodiment of an LCD panel including a first substrate having a first substrate material, a plurality of thin film transistors formed on the first substrate material each thin film transistor having a drain electrode, and an organic layer formed on the plurality of TFTs which includes a color filter layer, a second substrate disposed opposite to the first substrate and including a second substrate material, a main column spacer having a first end connected to the first substrate, and a second end connected to the second substrate, a sub column spacer having a first end connected to one of the first and second substrates, and a second end being spaced apart from the other one of the first and second substrates, and a recessed portion formed in at least one of the first and second substrates corresponding to the sub column spacer.

According to another exemplary embodiment of the present invention, the depth of the recessed portion ranges from about 0.1 μm to about 1 μm.

According to another exemplary embodiment of the present invention, the main column spacer is formed on at least one of the plurality of thin film transistors.

According to another exemplary embodiment of the present invention, a first gap between the first and second substrates corresponding to the main column spacer is smaller than a second gap between the first and second substrates corresponding to the sub column spacer.

According to another exemplary embodiment of the present invention, the main column spacer is substantially equal in length to the sub column spacer.

According to another exemplary embodiment of the present invention, the LCD panel further includes a pixel electrode formed on the organic layer.

According to another exemplary embodiment of the present invention, the organic layer is formed with a drain contact hole which exposes the drain electrode, and the pixel electrode is electrically connected with the drain electrode through the drain contact hole.

According to another exemplary embodiment of the present invention, the second substrate further includes a black matrix formed on the second substrate material, and the recessed portion is formed on the black matrix.

According to another exemplary embodiment of the present invention, the LCD panel further includes a common electrode formed on the black matrix.

According to another exemplary embodiment of the present invention, the second substrate further includes a black matrix formed on the second substrate material, and the main column spacer and the sub column spacer are formed at positions corresponding to the black matrix.

According to another exemplary embodiment of the present invention, the recessed portion is formed on the organic layer.

According to another exemplary embodiment of the present invention, the recessed portion is formed on the color filter layer.

According to another exemplary embodiment of the present invention, the organic layer further includes an organic film formed on the color filter layer, the color filter layer is formed with a color filter recessed portion, and the recessed portion is formed on the organic film corresponding to the color filter recessed portion.

According to another exemplary embodiment of the present invention, the organic layer further includes an organic film formed on the color filter layer, and the recessed portion is formed on the organic film.

According to another exemplary embodiment of the present invention, the thickness of the organic layer substantially blocks light from passing through to the plurality of thin film transistors.

The foregoing and/or other exemplary embodiments of the present invention can achieved by providing a method of fabricating an LCD panel, including forming a plurality of thin film transistors each having a drain electrode on a first substrate material, preparing a first substrate by forming an organic layer, which is formed with a recessed portion and includes a color filter layer, on the plurality of thin film transistors, preparing a second substrate by forming a main column spacer and a sub column spacer which have the same length on a second substrate material, and combining the first substrate and the second substrate to each other so the main column spacer contacts the first substrate and the sub column spacer is placed in a position corresponding to the recessed portion and spaced apart from the first substrate.

According to another exemplary embodiment of the present invention, the preparing a second substrate includes forming the main column spacer on at least one of the plurality of thin film transistors.

According to another exemplary embodiment of the present invention, the preparing a first substrate includes forming the recessed portion by a photosensitive process using one of a slit mask and a translucent mask.

According to another exemplary embodiment of the present invention, the method further includes forming a pixel electrode after forming the organic layer.

According to another exemplary embodiment of the present invention, the method further includes forming a drain contact hole which exposes the drain electrode on at least one of the plurality of thin film transistors while the organic layer is formed, and wherein the pixel electrode is electrically connected with the drain electrode through the drain contact hole.

According to another exemplary embodiment of the present invention, the preparing the second substrate includes forming a black matrix on the second substrate material, and forming the main and sub column spacers on the black matrix.

According to another exemplary embodiment of the present invention, the method further includes forming a common electrode on the black matrix after forming the black matrix, and forming the main and sub column spacers on the common electrode.

According to another exemplary embodiment of the present invention, the preparing a first substrate includes forming the recessed portion on the color filter layer.

According to another exemplary embodiment of the present invention, the preparing a first substrate further includes forming an organic film on the color filter layer, forming a color filter recessed portion on the color filter layer, and forming the recessed portion on the organic film corresponding to the color filter recessed portion.

According to another exemplary embodiment of the present invention, the preparing a first substrate further includes forming an organic film formed on the color filter layer, and forming the recessed portion on the organic film.

BRIEF DESCRIPTION OF THE DRAWINGS

The above and/or other aspects, advantages, and features of the present invention will become apparent and more readily appreciated from the following description of the exemplary embodiments, taken in conjunction with the accompanying drawings, in which.

DETAILED DESCRIPTION OF THE INVENTION

Figure 1:
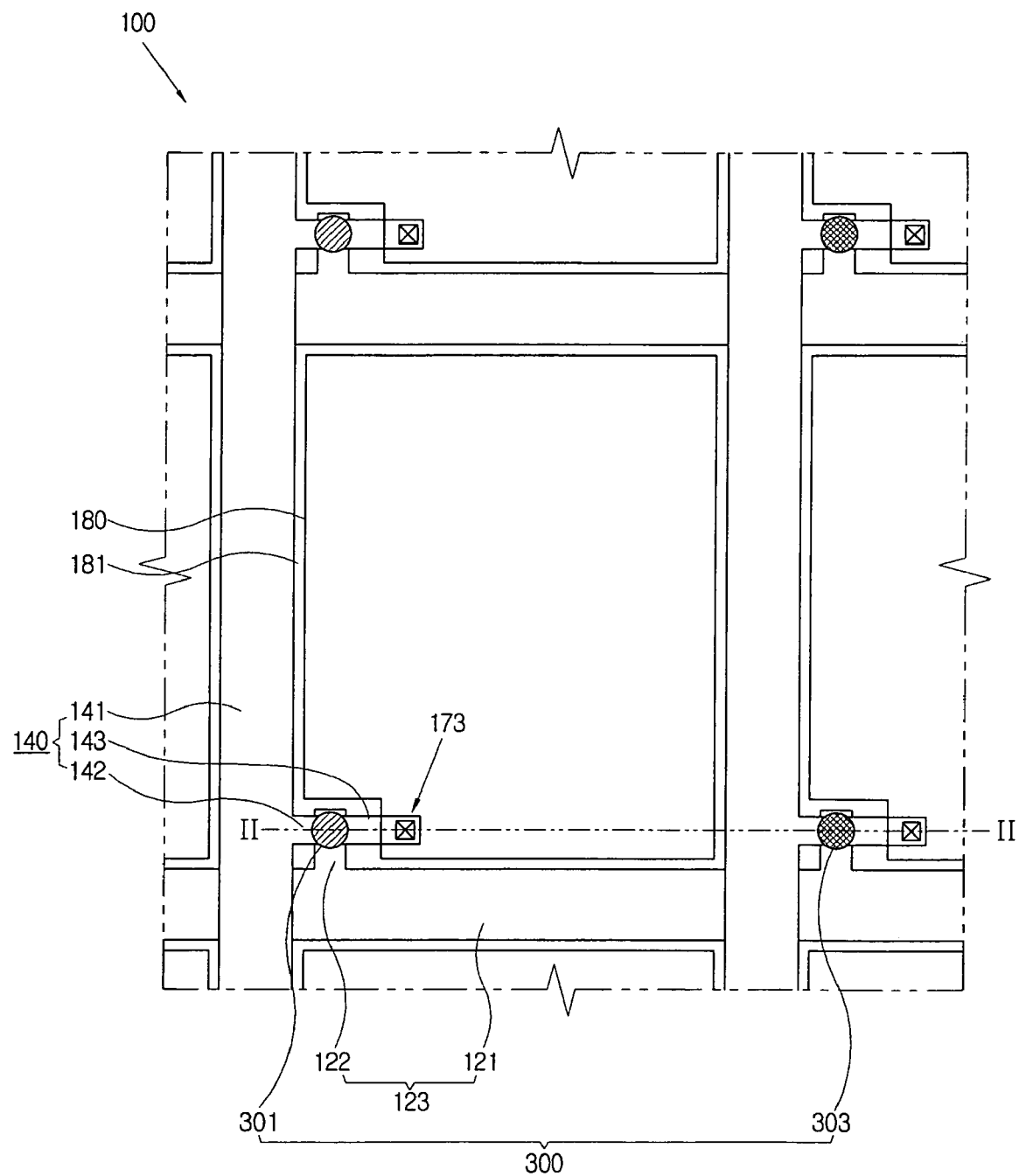
FIG. 1 is a schematic plan view of an exemplary embodiment of an LCD panel according to the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the drawings, the thickness and size of layers, films, and regions are exaggerated for clarity.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail with reference to the accompanying drawings.

Figure 2:
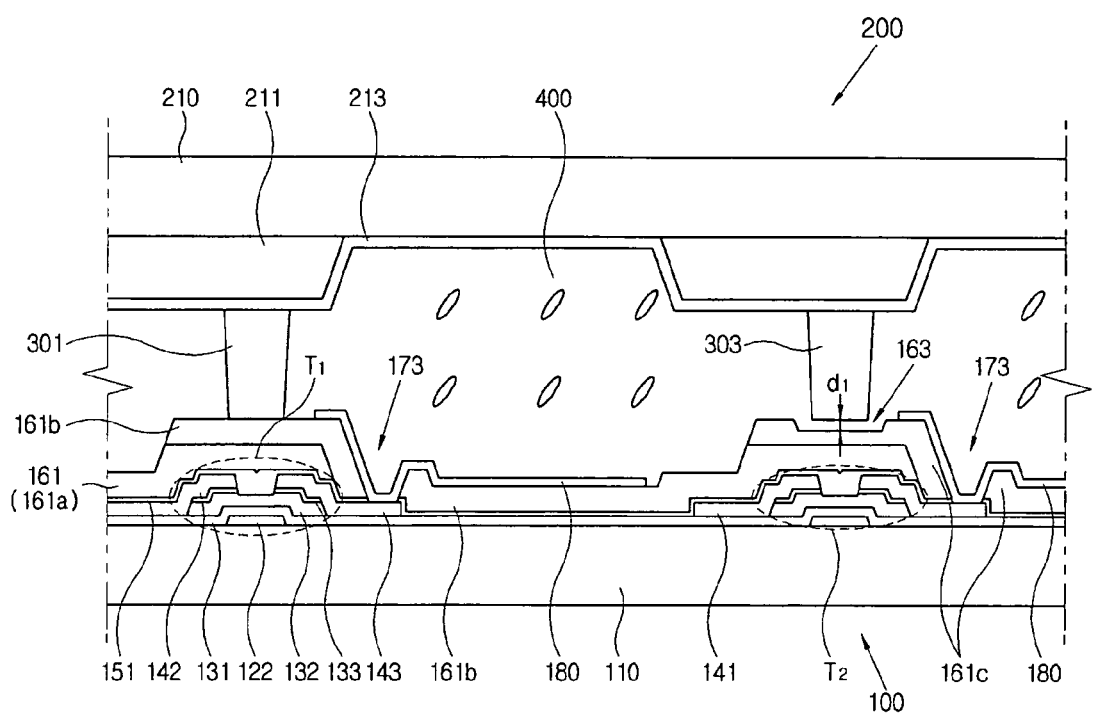
FIG. 2 is a cross-sectional view of the LCD panel taken along line II-II of FIG. 1.

An LCD panel according to an exemplary embodiment of the present invention will be described with reference to FIGS. 1 and 2. FIG. 1 is a schematic plan view of an exemplary embodiment of a first substrate of an LCD panel according to the present invention, and FIG. 2 is a cross-sectional view of the LCD panel, taken along line II-II of FIG. 1.

The LCD panel according to an exemplary embodiment of the present invention includes a first substrate 100, a second substrate 200 opposite to the first substrate 100, a column spacer assembly 300 maintaining a constant cell gap between the first and second substrates 100 and 200, and a liquid crystal layer 400 interposed between the first and second substrates 100 and 200.

In the first substrate 100, gate wiring 123 is formed on a first substrate material 110 made of glass. The gate wiring 123 includes a plurality of gate lines 121 which may be horizontally and arranged in parallel with one another, and, gate electrodes 122 which may be connected to the gate lines 121. Here, the gate wiring 123 may be formed as a single metal layer or multiple layers of metal.

A gate insulating layer 131 is formed on the first substrate material 110 and the gate wiring 123. According to an exemplary embodiment of the present invention the gate insulating layer 131 may be made of silicon nitride (SiNx) or a similar substance.

A semiconductor layer 132 is formed on the gate insulating layer 131 above the gate electrode 122. According to an exemplary embodiment the semiconductor layer 132 may be made of amorphous silicon or a similar substance. An ohmic contact layer 133 is formed on the semiconductor layer 132. According to an exemplary embodiment the ohmic contact layer 133 is made of n+ hydrogenous amorphous silicon highly doped with silicide or n-type impurities. The semiconductor layer 132 is formed on the gate electrode 122 like an island, and the ohmic contact layer 133 is divided into two parts with respect to the gate electrode 122.

Data wiring 140 including data lines 141, source electrodes 142 and drain electrodes 143 is formed on the ohmic contact layer 133 and the gate insulating layer 131. Data lines 141 are formed at regular intervals and perpendicularly intersect the gate lines 121 to define pixels; source electrodes 142 branch from the data lines 141 and extended toward a top portion of the ohmic contact layer 133; and drain electrodes 143 are separated from the source electrodes 142 and face the source electrodes 142 across the gate electrode 122. Like the gate wiring 123, the data wiring 140 may be formed as a single metal layer or multiple layers of metal.

An inorganic film 151 is formed as a passivation layer on the data wiring 140, the exposed areas of the ohmic contact layer, and the semiconductor layer 132 which is not covered with the data wiring 140. According to an exemplary embodiment, the inorganic film 151 is made of silicon nitride. Further, the inorganic film 151 is removed at a drain contact hole 173 to expose the drain electrode 143. After forming the passivation layer, the thin film transistors T1 and T2, shown by the dotted lines T1 and T2 respectively, are completed.

A color filter layer 161 is formed on the inorganic film passivation layer 151. The color filter layer 161 includes one of a red, green and blue colored photosensitive organic material. A red color filter layer 161a, a green color filter layer 161b and a blue color filter layer 161c are alternately formed in each pixel region 181 of the first substrate 100. The color filter layer 161 tints the light passing through the first substrate 100. Similar to the inorganic film 151, the color filter layer 161 may be removed at the drain contact hole 173 to expose the drain electrode 143.

Above the thin film transistor T2, the blue color filter layer 161c is formed with a recessed portion 163. The depth d1 of the recessed portion 163 ranges from about 0.1 μm to about 1 μm in order to create a favorable liquid crystal injection margin while maintaining effective dispersion of stress applied to the column spacer assembly 300. However, the scope of the present invention is not limited thereto. According to another exemplary embodiment, the depth d1 of the recessed portion 163 ranges 0.5 μm to 0.6 μm.

A pixel electrode 180 is formed on the color filter layer 161. The pixel electrode 180 is made of indium tin oxide (ITO), indium zinc oxide (IZO) or similar substances. The pixel electrode 180 may be electrically connected with the drain electrode 143 via the drain contact hole 173.

Alternative exemplary embodiments include configurations including an alignment film (not shown) which may be formed on the pixel electrode 180 and the portion of the color filter layer 161 which is not covered with the pixel electrode 180. The alignment layer functions to smoothly align the liquid crystal molecules of the liquid crystal layer 400.

The second substrate 200, placed above and opposite the first substrate 100, includes a second substrate material 210, a black matrix 211 formed to have a lattice pattern on the second substrate material 210, and a common electrode 213 formed on the second substrate material 210 and the black matrix 211.

The black matrix 211 may be made of black colored photosensitive organic materials and distinguish between the pixel regions 181. Alternatively, the black matrix 211 may be made of a single metal layer of chrome, chrome oxide, chrome nitride, or similar substances. Alternative embodiments include the configuration where the black matrix 211 is made of multiple layers or of combinations of the above metals.

The black matrix 211 may be shaped like a lattice corresponding to the gate lines 121 and the data lines 141 of the first substrate 100. As shown in the drawings, the black matrix 211 is also formed above the semiconductor layer 132, thereby preventing light from entering into the semiconductor layer 132 of the thin film transistors. Because the column spacer assembly 300 may be formed corresponding to the semiconductor layer 132, the black matrix 211 is also placed corresponding to the column spacer assembly 300, thereby preventing an aperture ratio thereof from decreasing.

The common electrode 213 is formed covering the portion of the second substrate material 200 not covered by the black matrix 211. According to an exemplary embodiment the common electrode 213 is made of a transparent conductive material such as ITO, IZO, or a similar substance. In conjunction with the pixel electrode 180 of the first substrate 100, the common electrode 213 applies a signal voltage to the liquid crystal layer 400.

Alternative exemplary embodiments include configurations where an overcoat layer (not shown) may be formed between the black matrix 211 and the common electrode 213. The overcoat layer covers the black matrix 211 and the portions of the second substrate material 210 not covered by the black matrix 211. The overcoat layer protects the black matrix 211 and may be made of an organic material.

Alternative exemplary embodiments include configurations where an alignment film (not shown) may be formed on the common electrode 213, to smoothly align the liquid crystal molecules of the liquid crystal layer 400.

The column spacer assembly 300 is disposed between the first substrate 100 and the second substrate 200 in order to maintain a uniform cell gap therebetween. Specifically, the column spacer assembly 300 is formed above the thin film transistor between the color filter layer 161 and the black matrix 211. This configuration prevents the aperture ratio from decreasing. The column spacer assembly 300 includes a main column spacer 301 and a sub column spacer 303, which are substantially equal in length. The column spacer assembly 300 is made of a photosensitive organic material.

The main column spacer 301 includes a first end connected to the green color filter layer 161b on the thin film transistor T1 of the first substrate 100, and a second end connected to the black matrix 211 of the second substrate 200. Alternative exemplary embodiments include configurations where the main column spacer 301 is connected to alignment layers on the color filter layer and the black matrix.

The sub column spacer 303 includes a first end connected to the black matrix 211 of the second substrate 200, and a second end spaced a small distance from the recessed portion 163 formed in the blue color filter layer 161c of the first substrate 100. The gap created between the sub column spacer and the recessed portion 163 of the blue color filter layer 161c is equal to the depth d1 of the recessed portion 163. Thus, the recessed portion 163 allows the first and second substrates 100 and 200 to be able to flex apart at that location and increase the volume therebetween. The location where the fist and second substrates 100 and 200 are joined by the main column spacer is not as flexible due to the rigid fixation of the main column spacer to both sides of the substrate.

As described above, according to an exemplary embodiment of the present invention, even though the column spacers 301 and 303 have the same lengths, only the main column spacer 301 has both ends connected to the first and second substrates 100 and 200, whereas the sub column spacer includes a second end spaced apart from the first substrate 100, thereby achieving an aspect of the present invention.

In general, only the main column spacer 301 is used in maintaining the cell gap between the first and second substrates 100 and 200. Thus, when internal pressure is applied to the LCD panel, as during liquid crystal injection, the relatively small number of main column spacers 301 which are connected to both the first and second substrates 100 and 200 are largely deformed by that pressure. This ability to deform under pressure allows the amount of liquid crystal filling between the first and second substrates to be easily controlled and increases the liquid crystal injection margin.

Conversely, when external force is applied to the LCD panel, the second end of the sub column spacer 303 comes into contact with the recessed portion 163 of the first substrate 100. When this happens, the sub column spacer 303 as well as the main column spacer 301 may become connected to both the first and second substrates 100 and 200. Accordingly, both the sub column spacer 303 and the main column spacer 301 may receive the pressure applied to the LCD panel, so that the pressure may be effectively dispersed and distributed by the column spacer assembly 300. Thus, the column spacer assembly 300 may prevent external forces from damaging the color filter layer 161 or the black matrix 211.

In the meantime, a sealant (not shown) is provided along edges of the first and second substrates 100 and 200 so as to combine the first and second substrates 100 and 200 to each other. The sealant includes a resin which sets in ultraviolet light, such as acrylic resin. Exemplary embodiments include configurations where the sealant may include a thermo setting resin such as an epoxy resin, an amine hardener, filler such as an alumina powder, and a spacer. To form the sealant as desired, a screen mask method and a dispense method may be used. The sealant may be formed with an injection hole to inject the liquid crystal therethrough.

The liquid crystal layer 400 is filled in the space formed between two substrates 100 and 200 and the sealant. Further, the liquid crystal molecules of the liquid crystal layer 400 are aligned by a voltage difference between the pixel electrode 180 and the common electrode 213.

Below, an exemplary embodiment of a method of fabricating the LCD panel according to the present invention will be described with reference to FIGS. 1 and 3A through 3C. A method of fabricating the second substrate 200 and a method of combining the two substrates 100 and 200 to each other can be implemented by any of several well-known methods, so the following mainly describes a method of fabricating the first substrate 100.

Figure 3A:
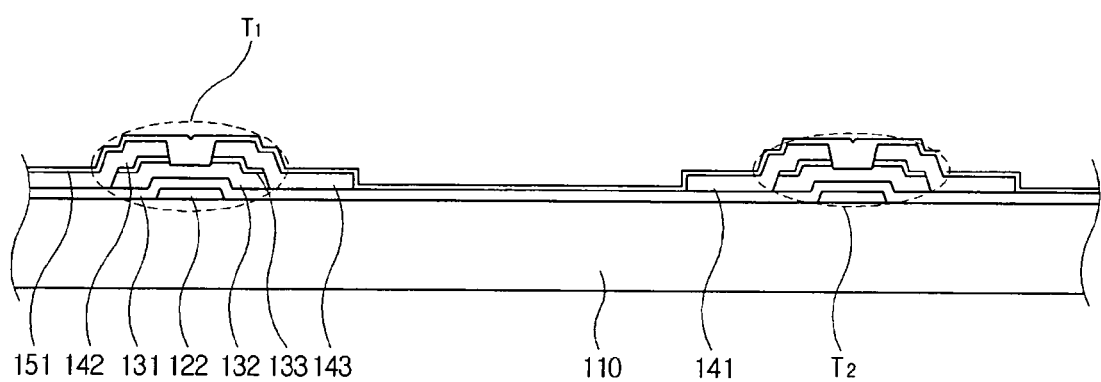
FIGS. 3A through 3C are cross-sectional views sequentially showing an exemplary embodiment of a process of fabricating the LCD panel according to the present invention.

As shown in FIG. 3A, thin film transistors T1 and T2 and the passivation inorganic film 151 are formed on the first substrate material 110. A gate metal layer is deposited and patterned to form the gate line 121 and the gate electrode 122.

The gate insulating layer 131, the semiconductor layer 132, and the ohmic contact layer 133 may be sequentially formed on the gate electrode 122. In detail, the gate insulating layer 131, which may include an inorganic material such as silicon nitride, may be deposited. After depositing the gate insulating layer 131, the semiconductor layer 132, which may include amorphous silicon, and the ohmic contact layer 133, which may include n+ silicon, are deposited. The gate insulating layer 131, the semiconductor layer 132, and the ohmic contact layer 133 are sequentially formed as a triple layer. The semiconductor layer 132 and the ohmic contact layer 133 may be patterned so that they remain on only the top portion of the gate electrode 122. The semiconductor layer 132 and the ohmic contact layer 133 may be formed where the gate line 121 and the data line 141 overlap each other.

A data metal layer may be deposited and patterned to form the data lines 141, the source electrodes 142 and the drain electrodes 143, thereby completing the thin film transistors T1 and T2.

Figure 3B:
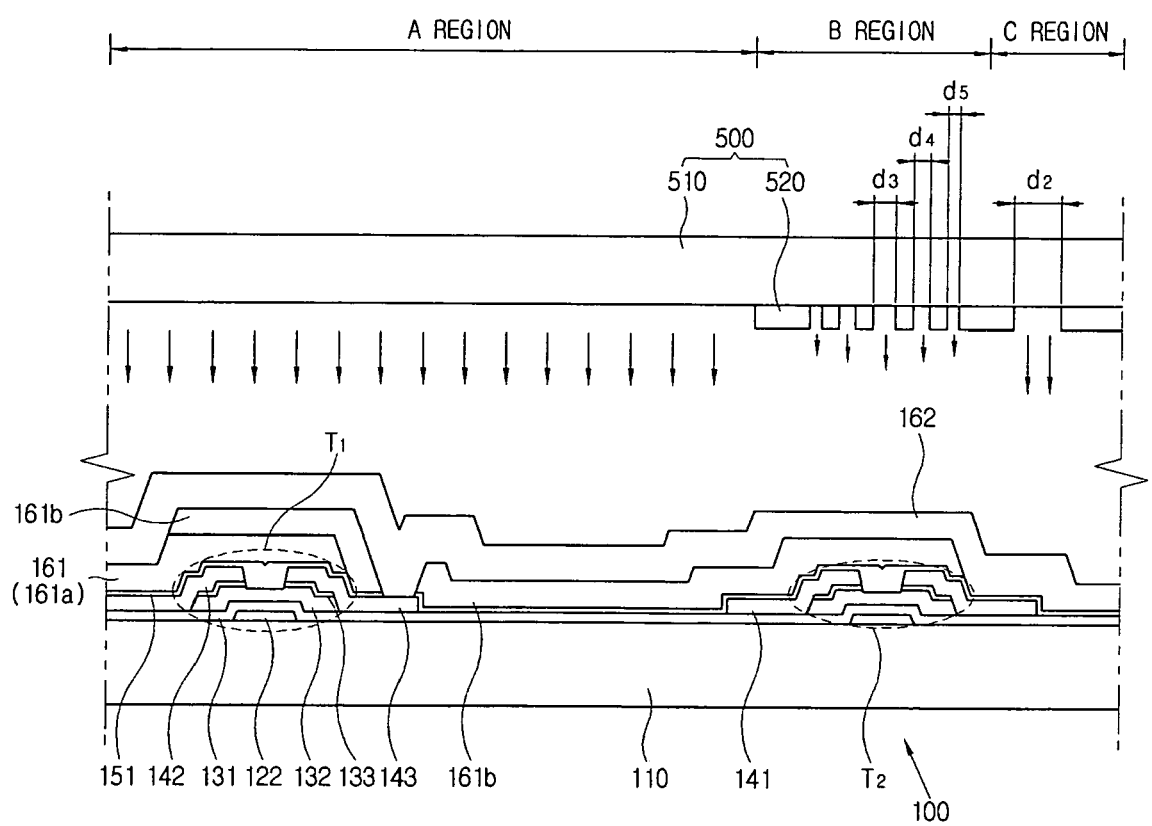

The inorganic film 151 may be formed on the thin film transistors T1 and T2. As shown in FIG. 3B, the color filter layer 161 is formed on the inorganic film 151.

In forming the color filter layer 161, a red color photosensitive organic material is applied to the inorganic film 151, exposed to light through a mask (not shown), and developed and baked, thereby forming the red color filter layer 161a on a predetermined pixel region 181.

Similarly, the green color filter layer 161b is formed in a pixel region 181 adjacent to the pixel region 181 corresponding to the red color filter layer 161a. The red color filter layer 161a and the green color filter layer 161b overlap each other on the thin film transistor T1. The green color filter layer 161b is partially removed to expose the inorganic film 151 on the drain electrode 143, and then the green color filter layer 161b is etched using a mask to remove the inorganic film 151, thereby forming the drain contact hole 173.

Referring to FIG. 3B, a positively charged and colored photosensitive organic material 162 is applied to form the blue color filter layer 161c. The organic material 162 may be exposed to ultraviolet radiation through a slit mask 500. The masking process is not limited to using the slit mask 500, and may use alternative masking devices such as a translucent mask.

An exemplary embodiment of the slit mask 500 used in the exposure includes a transparent mask substrate material 510 and an opaque film 520 which may have multiple slits. The opaque film 520 may include chrome, chrome oxide, or a combination thereof, which is opaque to ultraviolet radiation.

The mask 500 may be divided into three regions: an A region including the mask substrate material 510; a B region including the mask substrate material 510 and the opaque film 520 which may be formed with slits having various widths d3 through d5; and a C region including the mask substrate material 510 and the opaque film 520 which may be formed with a slit having a width d2 larger than d3.

When ultraviolet radiation is applied to the first substrate 100 through the mask 500, the A region transmits most of the radiation because it includes only the transparent substrate 510. The colored photosensitive organic material 162 placed under the A region is exposed to a comparatively large amount of ultraviolet radiation and entirely hardened and developed. Referring to FIG. 3B, the arrows of varying length represent different exposure intensities to the ultraviolet radiation.

In the B region, much of the ultraviolet radiation is blocked while passing through the mask substrate material 510 and the opaque film 520 formed with the slits. As a result the colored photosensitive organic material 162 placed under the B region may be exposed to a relatively small amount of ultraviolet radiation. The greatest exposure intensity arises in the slit having width d3, the next greatest exposure intensity arises in the slit having width d4, and the lowest exposure intensity arises in the slit having width d5. With this structure, the recessed portion 163 can be smoothly stepped.

Figure 3C:
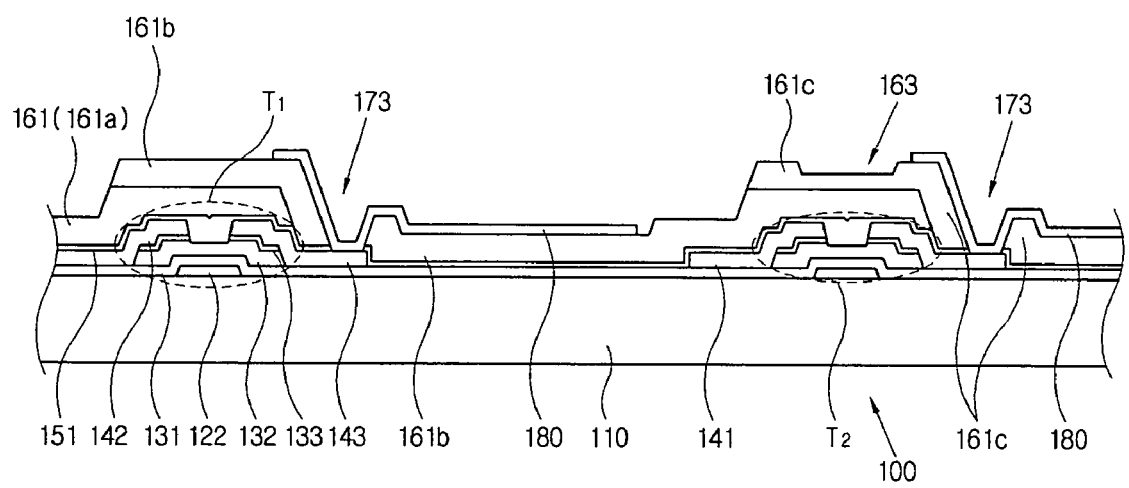

The ultraviolet radiation may have the same intensity in the C region as that in the A region, but the ultraviolet radiation may be applied to only a limited portion of the colored photosensitive organic material 162 because it passes through only the slit of width d2. The portion of the colored photosensitive organic material 162 which was hardened due to the partial exposure is developed, and then the underlying inorganic film 151 is etched, thereby forming the drain contact hole 173. As shown in FIG. 3C, the resulting blue color filter layer 161c is formed with the recessed portion 163 and the drain contact hole 173, so that the filter layer 161 with three colors may be formed.

A transparent conductive material such as ITO, IZO or a similar substance is deposited on the color filter layer 161. An exemplary embodiment of the deposition method is sputtering method, thereby forming the pixel electrode 180 may be formed. Further, the alignment layer (not shown) is formed on the pixel electrode 180, thereby forming the first substrate 100.

In fabricating the second substrate 200, the black matrix 211 is formed as a lattice pattern on the second substrate material 210.

The black matrix 211 is formed by the following process. Black coloring is added to a photosensitive organic material, thereby preparing a black matrix photoresist. Exemplary embodiments of the black coloring include carbon black or titanium oxide. The black matrix photoresist is applied to the second substrate material 210, and then exposed, developed and baked, thereby forming the black matrix 211. Alternative embodiments include configurations where the black matrix may be made as a single metal layer of chrome, chrome oxide, chrome nitride, or similar materials, or a multilayer combination thereof.

The common electrode 213 is formed on the second substrate material 210 and the black matrix 211. The common electrode 213 is formed throughout the second substrate 200. The common electrode 213 may be formed from a transparent conductive material such as ITO, IZO or a similar substance. An exemplary embodiment of a method for forming the common electrode includes the use of a sputtering method.

The alignment layer (not shown) may be formed on the common electrode 213. The column spacer assembly 300 is formed on the alignment layer corresponding to the black matrix 211. Similarly to the color filter layer 161, the column spacer assembly 300 is formed by applying a photosensitive organic material, and then exposing, developing and baking the photosensitive organic material. Thus, the second substrate 200 is formed.

The first substrate 100 and the second substrate 200 are combined by the sealant (not shown) so that the main column spacer 301 is in contact with the alignment layer (not shown) on the thin film transistor T1 of the first substrate 100 and the sub column spacer 303 is spaced slightly apart from the recessed portion 163 of the first substrate 100.

The liquid crystal layer 400 is formed between the first and second substrates 100 and 200, thereby forming the LCD panel of FIG. 2.

The liquid crystal layer 400 is formed by filling a space between the first and second substrates 100 and 200 with the liquid crystal after the first and second substrates 100 and 200 are combined by the sealant, which is called a filling method. An exemplary embodiment of the filling of the space with the liquid crystal is a method using vacuum and nitrogen gas under pressure. Alternative exemplary embodiments include configurations where the liquid crystal 400 may be formed by a dropping method where the liquid crystal is dropped onto one of the two substrates before the first and second substrates 100 and 200 are combined.

In the fabricating method according to the foregoing exemplary embodiment of the present invention, not only does the liquid crystal injection margin increase, but also stresses applied to the column spacer of the LCD panel can be efficiently dispersed.

Alternative exemplary embodiments include configurations where the recessed portion 163 of the color filter layer 161 may not be formed. In one exemplary device, the sub column spacer 303 is shorter than the main column spacer 301; thereby the sub column spacer 303 can be spaced apart from the first substrate 100.

Figure 4:
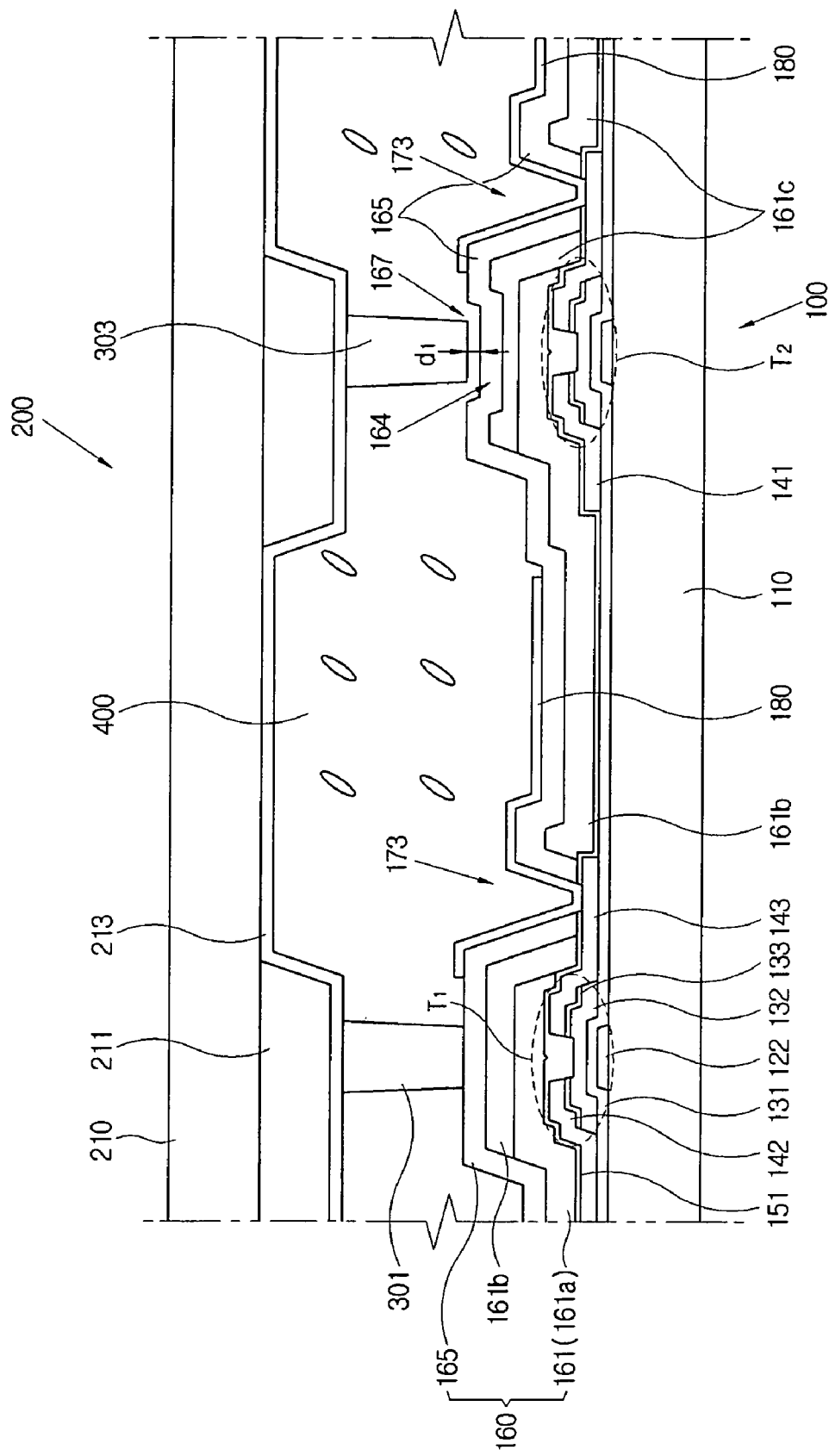
FIG. 4 is a cross-sectional view of another exemplary embodiment of an LCD panel according to the present invention.

Another exemplary embodiment of an LCD panel according to the present invention will be described with reference to FIG. 4. The LCD panel according to this exemplary embodiment of the present invention will be described focusing on differences from that of the foregoing exemplary embodiment. FIG. 4 is a cross-sectional view of another exemplary embodiment of an LCD panel according to the present invention.

The LCD panel according to this exemplary embodiment is substantially the same as that of the previous exemplary embodiment except that an organic layer 160 includes a color filter layer 161 formed on an inorganic film 151 and an organic film 165 formed on the color filter layer 161.

The organic film 165 is formed by a photosensitive process similar to the process used to form the color filter layer 161. The organic film 165 is removed at a drain contact hole 173 exposing the drain electrode 143. The organic film 165 is formed with a recessed portion 167 having the same depth as that of a color filter recessed portion 164 of a blue color filter layer 161c. A mask and associated slits may not be needed to form the recessed portion 167 because the organic film 165 is formed on the already recessed portion 164 of the blue color filter layer 161c. Thus, the recessed portion 167 of the organic film 165 may be formed without exposing it through the slits of a mask. However, because the organic film fills the contours of the pre-existing recessed portion 164 the recessed portion 167 of the organic film 165 may be narrower than the color filter recessed portion 164. One possible undesirable consequence of which is that the narrow recessed portion 167 may cause an error of alignment with the sub column spacer 303. To facilitate the alignment between the recessed portion 167 and the sub column spacer 303, the width of the color filter recessed portion 164 is formed to be larger than that of the foregoing exemplary embodiment, thereby preventing the width of the recessed portion 167 of the organic film 165 from decreasing to the point where it causes alignment errors. Therefore, a malfunction of alignment is reduced, or effectively prevented.

Referring to FIGS. 1 and 4, as signal lines such as a gate line 121 and a data line 141 approach a pixel electrode 180, the inorganic film 151 and the color filter layer 161 placed between the signal lines 121 and 141 and the pixel electrode 180 may form a dielectric and cause crosstalk. To reduce the crosstalk, the pixel electrode 180 is spaced at a predetermined distance from the top surface of the signal lines 121 and 141. However doing so, the aperture ratio is decreased. In an alternative exemplary embodiment the organic film 165 may reduce the capacitance of the dielectric by increasing the distance between the signal lines 121 and 141 and the pixel electrode 180, thereby decreasing the crosstalk. Thus, the organic film 165 allows the pixel electrode 180 to be closer to the top surface of the signal lines 121 and 141, thereby enhancing the aperture ratio.

Thus, in the present exemplary embodiment of the LCD panel according to the present invention as described above, similar aspects as those of the previous exemplary embodiment are obtained.

Figure 5:
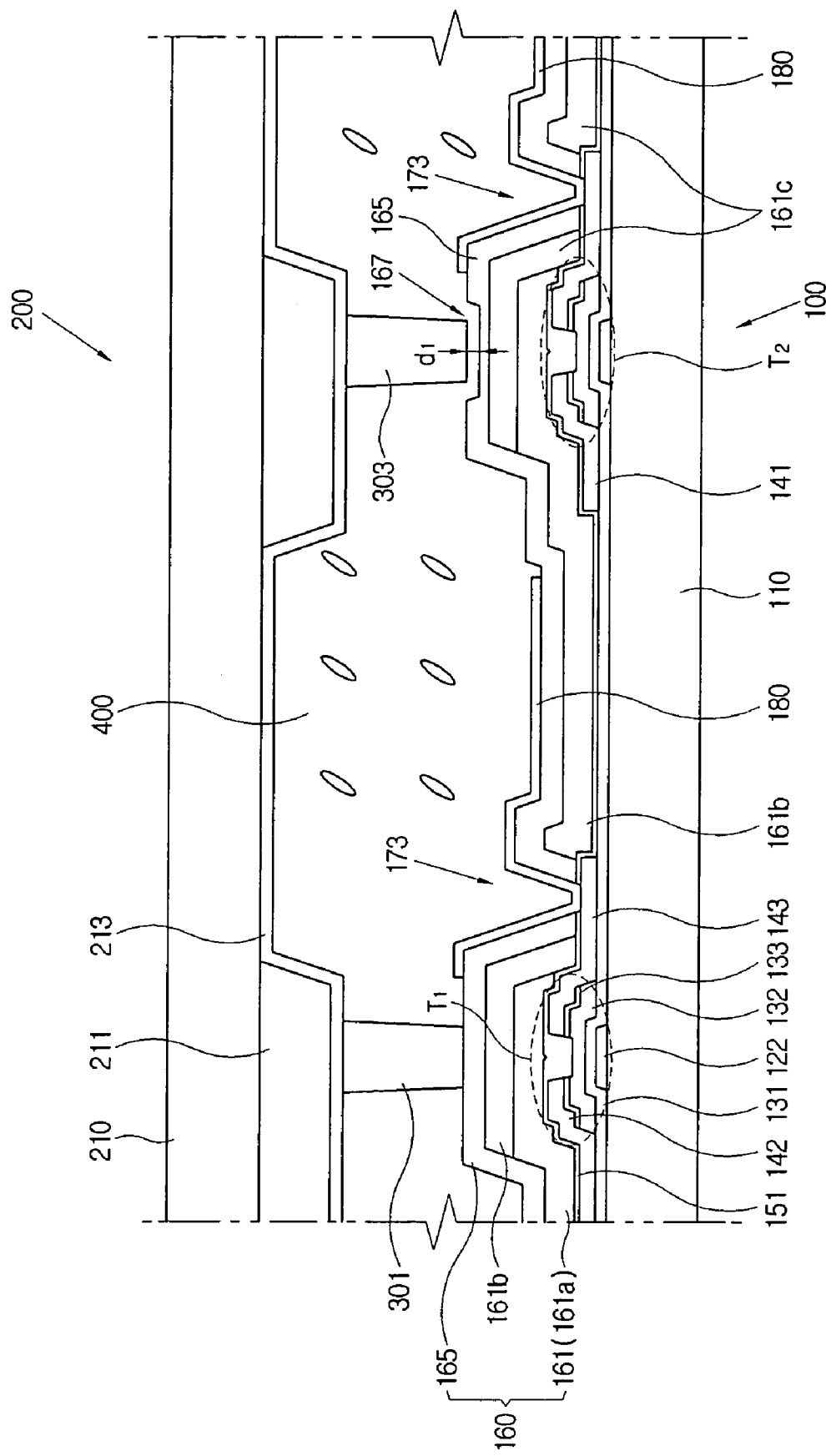
FIG. 5 is a cross-sectional view of still another exemplary embodiment of an LCD panel according to the present invention.

Hereinbelow, an LCD panel according to another exemplary embodiment of the present invention will be described with reference to FIG. 5. FIG. 5 is a cross-sectional view of an exemplary embodiment of an LCD panel according to the present invention.

Contrary to the preceding exemplary embodiment, the present exemplary embodiment of an LCD panel according to the present invention includes a blue color filter layer 161c without a recessed portion 164, and an organic film 165 with a recessed portion 167. In the process of fabricating the LCD panel, a mask (similar to that illustrated in FIG. 3B) may be used in forming the blue color filter layer 161c. This mask need not have a B region having a slit to form the recessed portion. The recessed portion 167 of the organic film 165 may be formed by any of several well-known methods, one exemplary embodiment of which is a photosensitive process similar to the process used to form the color filter layer 161. Thus, the present exemplary embodiment of an LCD panel according to the present invention obtains similar aspects as those of the forgoing exemplary embodiments.

Figure 6:
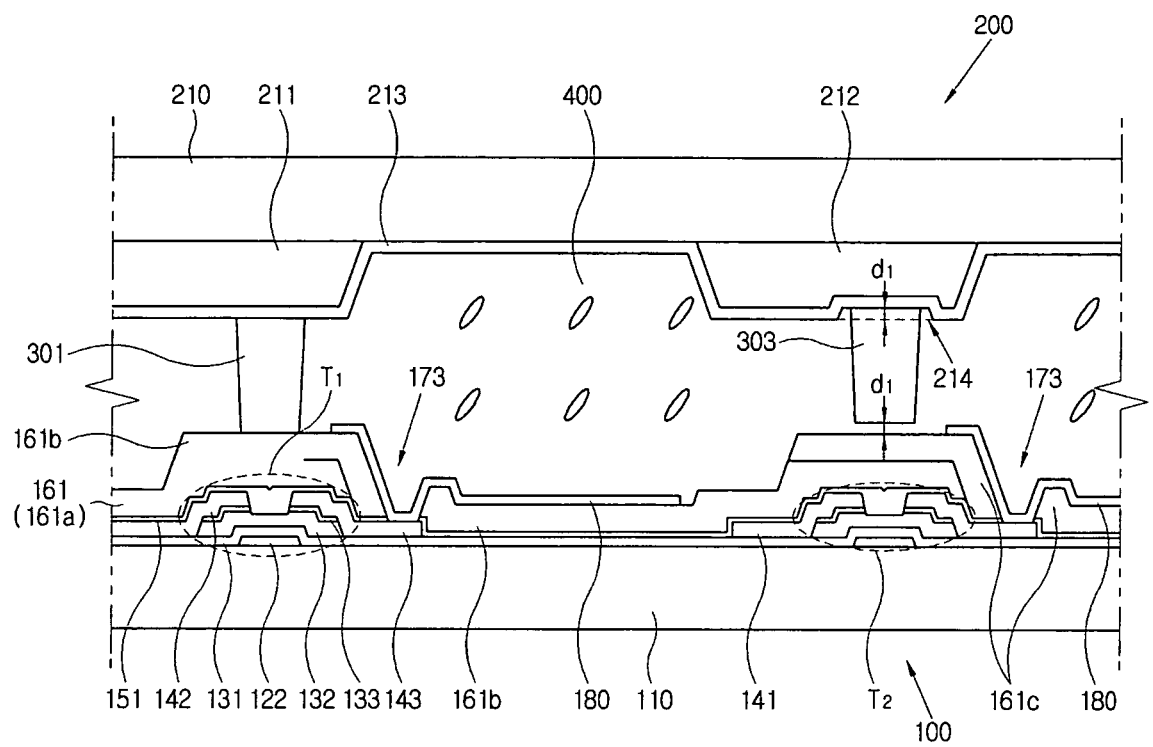
FIG. 6 is a cross-sectional view of yet another exemplary embodiment of an LCD panel according to the present invention.

Hereinbelow, another exemplary embodiment of an LCD panel according to the present invention will be described with reference to FIG. 6. FIG. 6 is a cross-sectional view of the LCD panel according to the another exemplary embodiment of the present invention.

Contrary to the foregoing embodiments, in the present exemplary embodiment of the LCD panel according to the present invention, a recessed portion 214 is formed on a modified black matrix 212 of a second substrate 200. Thus, the modified black matrix 212 includes the recessed portion 214, and the sub column spacer 303 is formed on the alignment layer (not shown) of the modified black matrix 212. Thus, the exemplary embodiment of the LCD panel according to the present invention obtains similar aspects as those of the forgoing exemplary embodiments.

Figure 7:
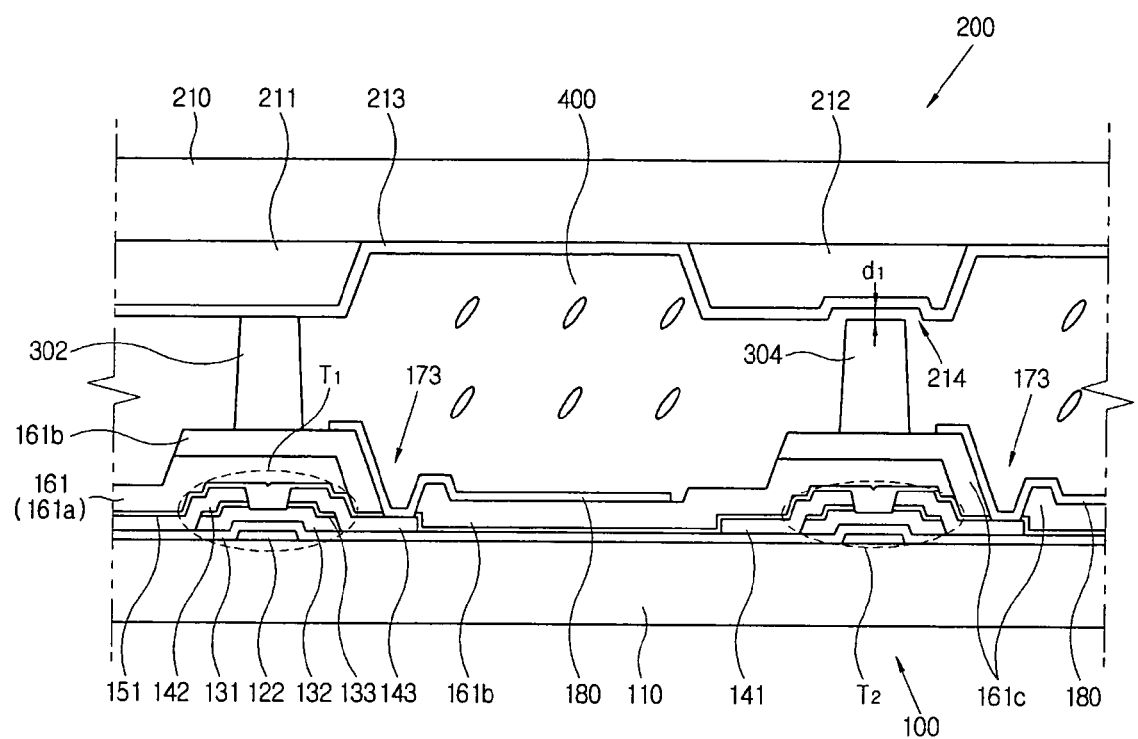
FIG. 7 is a cross-sectional view of another exemplary embodiment of an LCD panel according to the present invention.

Hereinbelow, another exemplary embodiment of an LCD panel according to the present invention will be described with reference to FIG. 7. FIG. 7 is a cross-sectional view of the LCD panel according to the another exemplary embodiment of the present invention.

Similar to the preceding exemplary embodiment, the LCD panel according to the present exemplary embodiment present invention includes a recessed portion 214 formed on a modified black matrix 212 of a second substrate 200. However, unlike the previous exemplary embodiment, a sub column spacer 304 is formed on a blue color filter layer 161c of a first substrate 100. Thus, the exemplary embodiment of an LCD panel according to the present invention obtains similar aspects as those of the foregoing exemplary embodiments.

Figure 8:
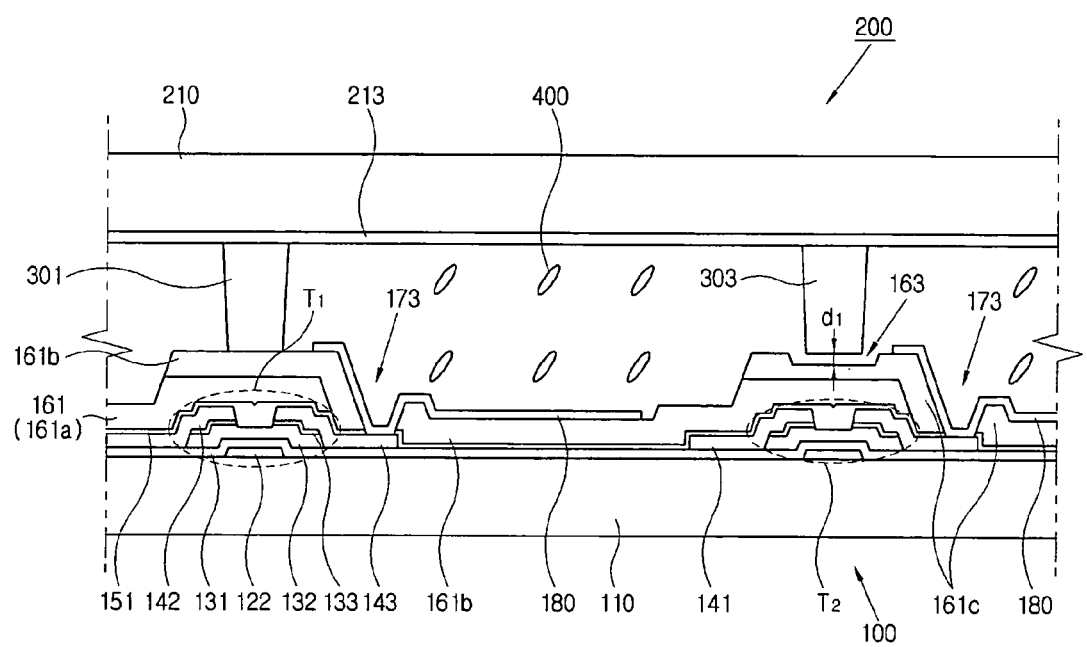
FIG. 8 is a cross-sectional view of another exemplary embodiment of an LCD panel according to the present invention.

Hereinbelow, another exemplary embodiment of an LCD panel according to the present invention will be described with reference to FIG. 8. FIG. 8 is a cross-sectional view of the LCD panel according to the another exemplary embodiment of the present invention.

Contrary to the foregoing exemplary embodiments, in the present exemplary embodiment a second substrate 200 includes a common electrode 213 directly formed on a second substrate material 210.

In the present exemplary embodiment, a first substrate 100 is formed including a dual layered color filter layer 161 which may be thick enough to substantially block light from interacting with a semiconductor layer 132. In this way the dual color filter layer may act as the black matrix. Thus, the second substrate 200 does not need to include the black matrix 212. This technique could be applied to the preceding exemplary embodiments except those embodiments including the recessed portion 214 on the modified black matrix 212. Thus, the exemplary embodiment of an LCD panel according to the present invention obtains similar aspects as those of the forgoing exemplary embodiments.

The foregoing exemplary embodiments may vary. In the foregoing exemplary embodiments, the sub column spacers 303 and 304 are formed corresponding to the blue color filter layer 161c, but the scope of the present invention is not limited thereto. The sub column spacers may be formed corresponding to the red and/or green color filter layers 161a and 161b. Further, the number of sub column spacers 303 and 304 may increase or decrease as necessary.

As described above, the present invention provides an LCD panel and a method of fabricating the same, in which a margin of liquid crystal injection is increased, and in which pressure applied to the LCD panel is efficiently dispersed.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. An LCD panel comprising:
   a first substrate comprising a first substrate material, a plurality of thin film transistors formed on the first substrate material, each thin film transistor having a drain electrode, and an organic layer formed on the thin film transistor and including a color filter layer;
   a second substrate disposed opposite to the first substrate and comprising a second substrate material;
   a main column spacer having a first end connected to the first substrate, and a second end connected to the second substrate;
   a sub column spacer having a first end connected to one of the first and second substrates, and a second end being spaced apart from the other one of the first and second substrates; and
   a recessed portion formed in at least one of the first and second substrates corresponding to the sub column spacer,
   wherein the main column spacer and sub column spacer are each formed on a different thin film transistor of the plurality of thin film transistors.

2. The LCD panel according to claim 1, wherein the depth of the recessed portion ranges from about 0.1 µm to about 1 µm.

3. The LCD panel according to claim 1, wherein a first gap between the first and second substrates corresponding to the main column spacer is smaller than a second gap between the first and second substrates corresponding to the sub column spacer.

4. The LCD panel according to claim 1, wherein the main column spacer is substantially equal in length to the sub column spacer.

5. The LCD panel according to claim 1, further comprising a pixel electrode formed on the organic layer.

6. The LCD panel according to claim 5, wherein the organic layer is formed with a drain contact hole which exposes the drain electrode, and the pixel electrode is electrically connected with the drain electrode through the drain contact hole.

7. The LCD panel according to claim 1, wherein the second substrate further comprises a black matrix formed on the second substrate material, and
   the recessed portion is formed on the black matrix.

8. The LCD panel according to claim 7, further comprising a common electrode formed on the black matrix.

9. The LCD panel according to claim 1, wherein the second substrate further comprises a black matrix formed on the second substrate material, and
   the main column spacer and the sub column spacer are formed at positions corresponding to the black matrix.

10. The LCD panel according to claim 1, wherein the recessed portion is formed on the organic layer.

11. The LCD panel according to claim 1, wherein the recessed portion is formed on the color filter layer.

12. The LCD panel according to claim 1, wherein the organic layer further comprises an organic film formed on the color filter layer,
   the color filter layer is formed with a color filter recessed portion, and
   the recessed portion is formed on the organic film corresponding to the color filter recessed portion.

13. The LCD panel according to claim 1, wherein the organic layer further comprises an organic film formed on the color filter layer, and
   the recessed portion is formed on the organic film.

14. The LCD panel according to claim 1, wherein the color filter layer includes two different colored color filters overlapping each other on the thin film transistor.

15. The LCD panel according to claim 14, wherein the overlapping color filters have a thickness sufficient to block light from interacting with a semiconductor layer of the thin film transistor and act as a black matrix.

16. The LCD panel according to claim 15, wherein the second substrate is absent a black matrix.

* * * * *